United States Patent
Hikami et al.

(10) Patent No.: US 6,791,807 B1
(45) Date of Patent: Sep. 14, 2004

(54) SPIN-VALVE MAGNETIC TRANSDUCING ELEMENT AND MAGNETIC HEAD HAVING FREE LAYER WITH NEGATIVE MAGNETOSTRICTION

(75) Inventors: Fuminori Hikami, Mishima-gun (JP); Hideyasu Nagai, Mishima-gun (JP); Masaki Ueno, Mishima-gun (JP); Marcos M. Lederman, Mishima-gun (JP); Hirohiko Kamimura, Mishima-gun (JP); Masahiko Ando, Mishima-gun (JP); Kenji Komaki, Mishima-gun (JP)

(73) Assignee: Read-Rite SMI Corporation, Osaka (JP)

( * ) Notice: Subject to any disclaimer, the term of this patent is extended or adjusted under 35 U.S.C. 154(b) by 0 days.

(21) Appl. No.: 09/326,002

(22) Filed: Jun. 4, 1999

(30) Foreign Application Priority Data

Jun. 10, 1998 (JP) .......................................... 10-176534

(51) Int. Cl.[7] .............................................. G11B 5/33
(52) U.S. Cl. ..................................................... 360/328
(58) Field of Search .............................. 360/314, 314.1, 360/314.12, 324, 325, 326, 327, 328, 324.1

(56) References Cited

U.S. PATENT DOCUMENTS

| | | | |
|---|---|---|---|
| 5,027,246 A | | 6/1991 | Numazawa et al. |
| 5,032,943 A | * | 7/1991 | Katsumata et al. ......... 360/327 |
| 5,422,571 A | | 6/1995 | Gurney et al. |
| 5,436,781 A | | 7/1995 | Matono et al. |
| 5,462,823 A | | 10/1995 | Evans et al. |
| 5,528,440 A | | 6/1996 | Fontana et al. |
| 5,580,667 A | | 12/1996 | Lal et al. |
| 5,608,593 A | | 3/1997 | Kim et al. |
| 5,708,358 A | | 1/1998 | Ravipati |
| 5,793,279 A | * | 8/1998 | Nepela ..................... 338/32 R |
| 5,871,622 A | | 2/1999 | Pinarbasi |
| 5,909,345 A | * | 6/1999 | Kawawake et al. ...... 360/324.1 |
| 5,933,297 A | * | 8/1999 | Hoshiya et al. .......... 360/324.1 |
| 5,999,378 A | * | 12/1999 | Saito et al. .................. 360/324 |
| 6,061,210 A | | 5/2000 | Gill |
| 6,074,743 A | | 6/2000 | Araki et al. |
| 6,088,204 A | * | 7/2000 | Farrow et al. ............... 360/327 |
| 6,108,176 A | * | 8/2000 | Yokoyama ............. 360/324.11 |
| 6,122,150 A | * | 9/2000 | Gill ....................... 360/324.11 |
| 6,141,191 A | * | 10/2000 | Lee et al. ................. 360/324.1 |
| 6,198,610 B1 | | 3/2001 | Kawawake et al. |
| 6,201,673 B1 | | 3/2001 | Rottmayer et al. |
| 6,208,491 B1 | | 3/2001 | Pinarbasi |
| 6,271,997 B1 | | 8/2001 | Gill |
| 6,278,592 B1 | | 8/2001 | Xue et al. |
| 6,313,973 B1 | | 11/2001 | Fuke et al. |
| 6,338,899 B1 | | 1/2002 | Fukuzawa et al. |
| 6,348,274 B1 | | 2/2002 | Kamiguchi et al. |
| 6,456,468 B1 | | 9/2002 | Hayashi |
| 6,646,835 B2 | | 11/2003 | Saito et al. |

FOREIGN PATENT DOCUMENTS

| | | |
|---|---|---|
| EP | 0 611 033 A2 | 1/1994 |
| WO | WO 94/11889 | 11/1993 |

OTHER PUBLICATIONS

1999 IEEE International Magnetics Conference Digest of Technical Papers, Giant Magnetoresistive (GMR) Sensor Microelectromechanical System (MEMS) Device, Dr. Rajeshuni Ramesham, Ph.D., Apr. 1999, vol. 5 No. 1.

* cited by examiner

*Primary Examiner*—Chen Tianjie
(74) *Attorney, Agent, or Firm*—Burgess & Bereznak, LLP

(57) ABSTRACT

A spin-valve magnetic transducing element. In one embodiment, a spin-valve magnetic transducing element is disclosed in which a ferromagnetic tunneling junction film, including first and second ferromagnetic layers and an insulating layer is enclosed between the ferromagnetic layers. A nonmagnetic metal thin film is inserted between the second ferromagnetic layer and the insulating layer, all of which are formed on a substrate.

1 Claim, 1 Drawing Sheet

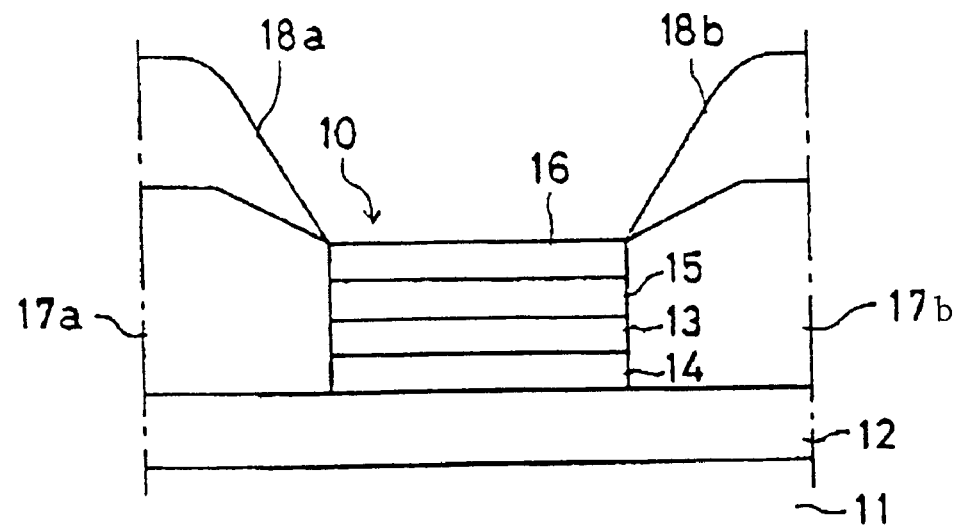
Fig. 1
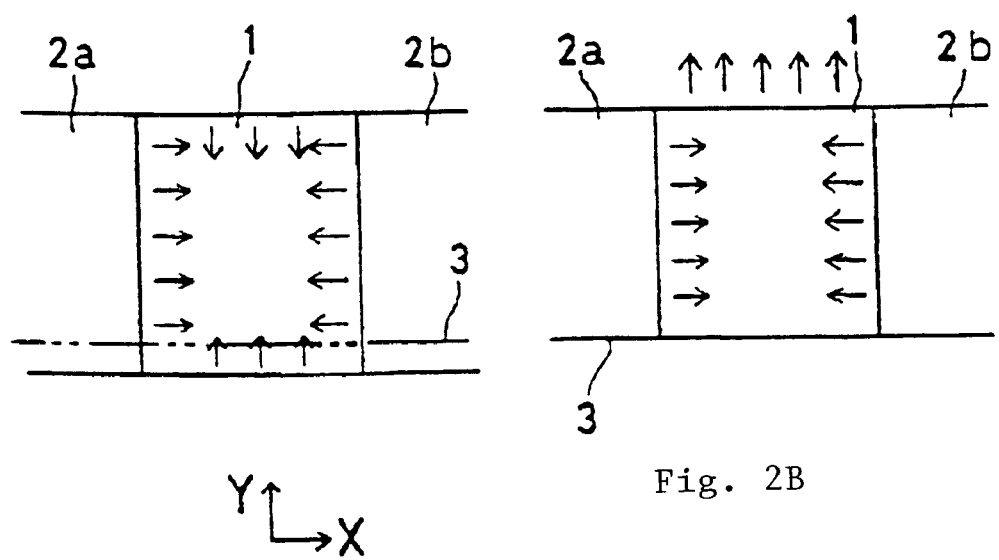
Fig. 2A
Fig. 2B

SPIN-VALVE MAGNETIC TRANSDUCING ELEMENT AND MAGNETIC HEAD HAVING FREE LAYER WITH NEGATIVE MAGNETOSTRICTION

BACKGROUND OF THE INVENTION

1. Field of the Invention

The present invention concerns a spin-valve magnetic transducing element in which, in essence, a free magnetic layer/nonmagnetic layer/fixed magnetic layer are formed in layers on a substrate, and the magnetization of the fixed magnetic layer is fixed by an antiferromagnetic layer, as well as a magnetic head equipped with such a spin-valve magnetic transducing element.

2. Background Information

In the past, magnetic transducing elements with a spin-valve film structure have been proposed in order to decrease the saturation magnetic field and raise the magnetic field sensitivity in magnetic heads for reproduction. In general, spin-valve films consist of a sandwich structure in which two opposing magnetic layers enclose a nonmagnetic layer (electrically conductive layer) on a substrate. The magnetization of one of the magnetic layers (the pinned layer) is fixed in the element height direction by an exchange-coupling magnetic field with an antiferromagnetic layer adjacent to it. The magnetization of the other magnetic layer (the free layer) is generally formed into a single magnetic domain in the track width direction of the element by a hard-bias method using the magnetic field of a permanent magnet, and it is free to rotate as the result of an external magnetic field.

Ideally, a spin-valve film should be used in a state in which the magnetization direction of the pinned layer and the magnetization direction of the free layer are perpendicular. When the magnetization of the free layer rotates due to a magnetic field from a recording medium or other outside source, differences in the angle between the magnetization directions of the pinned layer and free layer cause changes in the magnetoresistance of the element, and by this means signals recorded in the recording medium are detected.

As shown in FIG. 2A, the spin-valve film 1 is formed in approximately rectangular shape on a wafer; on its left and right sides are formed permanent-magnet films, and on top are formed lead layers 2a, 2b. In this state, a compressive stress acts on the spin-valve film 1 within its plane from both the X and Y directions. If, in order to cut away individual elements, the aforementioned wafer is cut in an air-bearing surface (ABS) indicated by the imaginary line 3, the stress at the ABS is released, so that the stress distribution changes; compressive stress acts on the spin-valve film 1 in the X direction and tensile stress acts in the Y direction, as shown in FIG. 2B.

In general, when the magnetostriction constant is positive, the magnetization of a magnetic film is oriented easily in the direction of action of tension, and when it is negative, the magnetization is oriented easily in the direction of action of compression In the structures of spin-valve films in the past, the magnetostriction constant of the free layer has been set targeting a value of zero, so that the influence of stress would not be felt. However, due to the composition of actual magnetic film materials and for other reasons, it is difficult to make the magnetostriction constant of the free layer exactly zero, and there exists scattering of approximately $\pm 3 \times 10^{-7}$ or so. Consequently the effect of stress is not completely eliminated, and there is the problem of the occurrence of scattering in the element sensitivity, so that stability is difficult.

Further, in many spin-valve films a single magnetic domain is induced in the free layer in the element track width direction by means of a hard-bias method in which permanent-magnet films are placed on either side as magnetic domain-controlling layers. In this case, both ends of the pinned layer are affected by the magnetic field of the aforementioned permanent-magnet films, and so there is concern that the magnetization direction may no longer be 90° from the magnetization direction of the free layer. For this reason, there is the problem that at both ends of the spin-valve film the MR ratio changes and sensitivity declines, so that as a whole, uniform sensitivity cannot be obtained in the track width direction.

SUMMARY OF THE INVENTION

A spin-valve magnetic transducing element is disclosed. In one embodiment, the spin-valve magnetic transducing element includes a free magnetic layer having a negative magnetostriction constant, a fixed magnetic layer, a nonmagnetic layer enclosed between the free and fixed magnetic layers and an antiferromagnetic layer adjacent to the fixed magnetic layer, formed in layers on a substrate. Additional features and benefits of the present invention will become apparent from the detailed description, figures and claims set forth below.

BRIEF DESCRIPTION OF THE DRAWINGS

FIG. 1 is a cross-sectional view seen from the ABS side of a preferred working example of a spin-valve film of the present invention.

FIG. 2A is a plan view of a spin-valve film formed on a wafer prior to ABS machining.

FIG. 2B is a plan view of a spin-valve film after ABS machining.

| Explanations of the Symbols | |
|---|---|
| 1 | Spin-valve film |
| 2a, 2b | Lead layers |
| 3 | ABS |
| 10 | Spin-valve film |
| 11 | Substrate |
| 12 | Base layer |
| 13 | Nonmagnetic layer |
| 14 | Magnetic layer, free layer |
| 15 | Magnetic layer, pinned layer |
| 16 | Antiferromagnetic layer |
| 17a, 17b | Permanent-magnet films |
| 18a, 18b | Lead layers |

DETAILED DESCRIPTION

The present invention was devised focusing on the above-described problems of magnetic films; its objective is to provide a high-performance magnetic transducing element equipped with a magnetically stable spin-valve film in which, by controlling the magnetostriction constant of the free layer, its magnetic anisotropy can be oriented in the ideal direction perpendicular to the magnetization direction of the pinned layer, and to provide a magnetic head.

Another objective of the present invention is, in a spin-valve film structure in which a hard bias is used to induce a single magnetic domain in the free layer, to reduce the influence on the pinned layer of the hard bias, and provide a high-performance magnetic head and magnetic transducing element from which uniform sensitivity in the track width direction is obtained.

The present invention provides a practical application of magnetoresistive elements utilizing the magnetoresistance effect based on a ferromagnetic tunneling junction. The present invention eliminates or considerably limits the generation of magnons occurring at the insulating layer/ferromagnetic layer tunneling junction interface, and suppresses the decrease in magnetoresistance ratio due to application of a bias voltage. With the present invention, a magnetic head suited to still higher-density recording is obtained The present invention is intended to achieve the above-described objectives; it is explained below using a working example shown in the drawings. The spin-valve magnetic transducing element of the present invention consists of a free magnetic layer, a fixed magnetic layer, a nonmagnetic layer enclosed between the two aforementioned magnetic layers, and an antiferromagnetic layer adjacent to the aforementioned fixed magnetic layer, formed in layers on a substrate, and is characterized by the fact that the aforementioned free magnetic layer has a negative magnetostriction constant.

Moreover, the present invention also provides a magnetic head equipped with such a spin-valve magnetic transducing element.

By thus intentionally setting the magnetostriction constant of the free magnetic layer to be negative, after machining the ABS, compressive forces within the plane of the spin-valve film act in a direction perpendicular to the element height direction, so that the magnetic anisotropy of the free layer is easily oriented in the direction perpendicular to the magnetization direction of the pinned layer.

Here, in a spin-valve film using the hard-bias method, the magnetic field of the permanent-magnet films can be made smaller than previously possible, so that the effect on the magnetic anisotropy of the pinned layer near both ends is reduced, and the element sensitivity is improved.

Particularly when the magnetostriction constant $\lambda$ of the free magnetic layer is within the range $0>\lambda>-1\times10^{-6}$, the element sensitivity is stable, and so this is desirable.

FIG. 1 shows a preferred working example of a spin-valve film to which the present invention is applied. The spin-valve film 10 consists of a sandwich structure in which a nonmagnetic layer 13 is enclosed between two opposing magnetic layers 14, 15, in layers on a base layer 12 formed on the substrate 11. On top of the magnetic layer 15 is formed an antiferromagnetic layer 16. Permanent-magnet films 17a, 17b are placed as magnetic domain-controlling layers on both the right and left sides of the spin-valve film 10, and on top of it are formed lead layers 18a, 18b as electrodes to pass a sense current.

The aforementioned two magnetic films are formed, as in the prior art, of permalloy, Co, CoFe, CoFeB, or similar material. The aforementioned antiferromagnetic layer can be formed from various alloys materials proposed in the past, such as FeMn-base, NiMn-base, PtMn-base, or IrMn-base alloys.

The magnetization of the magnetic layer 15 adjacent to the antiferromagnetic layer 16 is oriented in the element height direction by the well-known method of heat treatment in a magnetic field; the magnetization is fixed by means of the exchange-coupling magnetic field with the aforementioned antiferromagnetic layer. On the other hand, the magnetization of the other magnetic layer 14 is oriented in the element track width direction by the permanent-magnet films 17a, 17b, and rotates freely under the action of an external magnetic field. Ideally, the element is used in a state in which the magnetization directions of the fixed magnetic layer 15—that is, the pinned layer—and the free magnetic layer 14—that is, the free layer—are perpendicular.

In this working example, the magnetostriction constant $\lambda$ of the free layer 14 is set within the range $0>\lambda>-1\times10^{-6}$. As was explained above in connection with FIG. 2, after ABS machining a compressive stress acts in the X direction in the plane of the spin-valve film 10, enclosed between the permanent-magnet films 17a, 17b and the lead layers 18a, 18b on both the left and right sides. Because of this, the magnetic anisotropy of the free layer 14 can be oriented in the ideal X direction, so that the magnetic stability of the sensitivity of the magnetic transducing element is greatly improved.

In this way, the magnetic anisotropy of the free layer 14 is easily oriented in the X direction, that is, the track width direction, so that the magnetic field of the aforementioned permanent-magnet films can be made smaller than previously. Hence the effect of the magnetic field of the aforementioned permanent-magnet films acting near both ends of the pinned layer 15 is decreased, and the magnetic anisotropy can be fixed more stably in the element height direction along the track width direction. Consequently the element sensitivity becomes more uniform in the track width direction.

In actuality, upon sampling the relation of the electrical resistance to output for a magnetic transducing element equipped with a spin-valve film of the present working example and a magnetic transducing element using a spin-valve film of structure similar to the prior art employing a free layer with a magnetostriction constant k effectively equal to zero, it was found that whereas in the present working example the output increased stably in near-linear manner with increasing electrical resistance, in the example of the prior art the output declined, and moreover scattering was large. From these comparison results it was concluded that by means of the present invention, element sensitivity is greatly stabilized.

Moreover, even if the magnetostriction constant of the free layer is not within the aforementioned range of $0>\lambda>-1\times10^{-6}$, so long as it is intentionally set to a negative value, similar satisfactory and effective results can be obtained.

The present invention can be similarly applied to a dual-spin-valve structure. Further, the present invention can be executed with various variations and modifications added to the aforementioned working example, within its technical limits.

The present invention is configured as above, and so has the advantageous results described below.

In the magnetic transducing element of the present invention, after ABS machining, the magnetic anisotropy of the free layer of the spin-valve film is easily oriented in the track width direction of the element, so that the element sensitivity can be made much more stable than previously; moreover, the effect of hard biasing on the pinned layer can be reduced, so that a more uniform sensitivity in the track width direction is obtained, and a high-performance magnetic head with more stable reproduction characteristics can be obtained.

What is claimed is:

1. A spin-valve magnetic transducing element comprising:
   a free magnetic layer of a material that includes Co, the free magnetic layer having a negative magnetostriction constant $\lambda$ within the range $0>\lambda>-1\times10^{-6}$;
   a fixed magnetic layer;
   a nonmagnetic layer enclosed between the free and fixed magnetic layers; and
   an antiferromagnetic layer adjacent to the fixed magnetic layer.

* * * * *